(12) United States Patent
Babin et al.

(10) Patent No.: US 6,455,863 B1
(45) Date of Patent: Sep. 24, 2002

(54) APPARATUS AND METHOD FOR FORMING A CHARGED PARTICLE BEAM OF ARBITRARY SHAPE

(75) Inventors: Sergey Babin; Lee H. Veneklasen, both of Castro Valley, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/328,701

(22) Filed: Jun. 9, 1999

(51) Int. Cl.[7] .......................... H01J 37/30; H01J 37/147
(52) U.S. Cl. .................................. 250/492.23; 250/398
(58) Field of Search .................... 250/396 R, 396 ML, 250/398, 492.23

(56) References Cited

U.S. PATENT DOCUMENTS

| | | | | |
|---|---|---|---|---|
| 4,167,676 A | * | 9/1979 | Collier | 250/398 |
| 4,182,958 A | * | 1/1980 | Goto et al. | 250/492.23 |
| 4,393,308 A | * | 7/1983 | Anger et al. | 250/492.23 |
| 5,256,881 A | * | 10/1993 | Yamazaki et al. | 250/492.23 |
| 5,298,757 A | * | 3/1994 | Okayama et al. | 250/396 ML |
| 5,466,904 A | | 11/1995 | Pfeiffer et al. | 219/121.25 |
| 5,545,902 A | | 8/1996 | Pfeiffer et al. | 250/492.2 |
| 5,854,490 A | * | 12/1998 | Ooaeh et al. | 250/396 R |
| 6,069,364 A | * | 5/2000 | Itoh | 250/492.23 |

OTHER PUBLICATIONS

A High speed EBL column designed to minimize beam interactions, Lee H. Veneklasen, J. Vac. Sci. Technol. B3(1), Jan./Feb. 1985.

Multielectron beam blanking aperture array system SYN-APSE 2000, Hiroshi Yasuda, Soichiro Arai, Juichi Kai, Yoshihisa Ooae, Tomohiko Abe, Shigeru Maruyama, and Takashi Kiuchi, J. Vac. Sci. Technol. B 14(6), Nov./Dec. 1996.

Triangular–variable–shaped beams using the cell projection method, Yasuhiro Someda, Yasunari Shoda, and Norio Saitou, J. Vac. Sci. Technol. B 14(6), Nov./Dec. 1996.

WePrint 200–the Fast E–Beam Printer with High Throughput, O. Fortagne, P. Hahmann and Ch. Ehrlich, Microelectronic Engineering 27 (1995) 151–154.

Electron optical system for the x–ray mask writer EB–X2, Kenichi Saito, Hirofumi Morita, Junichi Kato, and Nobuo Shimazu, J. Vac. Sci. Technol. B 15(6), Nov./Dec. 1997.

\* cited by examiner

*Primary Examiner*—Bruce Anderson
(74) *Attorney, Agent, or Firm*—Jung-hua Kuo (57) ABSTRACT

A charged particle beam column for generating a variable shaped (in cross section) charged particle beam. The charged particle beam column includes: a source of a charged particle beam; a first aperture defining a first opening positioned coaxial to the beam and spaced apart from the source; a second aperture defining a second opening positioned coaxial to the beam and spaced apart from the first aperture; a third aperture defining a third opening positioned coaxial to the beam and spaced apart from the second aperture; an imaging device coaxial to the beam, where the imaging device controls focusing of the beam; and at least two deflection devices coaxial to the beam which controls a path of the beam through the openings. The charged particle beam column alternatively includes a source of a charged particle beam; a first aperture defining a first opening positioned coaxial to the beam and spaced apart from the source; a second aperture defining a second opening positioned coaxial to the beam and spaced apart from the first aperture; a solenoid lens which controls focusing of the beam; and at least one deflection device coaxial to the beam which controls a path of the beam through the openings.

23 Claims, 13 Drawing Sheets

APPARATUS AND METHOD FOR FORMING A CHARGED PARTICLE BEAM OF ARBITRARY SHAPE

BACKGROUND

1. Field of Invention

The invention relates to charged particle beam columns and in particular to charged particle beam columns that generate variable shaped beams.

2. Related Art

It is well known in the field of electron beam pattern generation that it is desirable to increase the throughput of pattern generation systems. The two main applications for such pattern generation systems are mask making for use in photolithography semiconductor fabrication and direct writing of patterns onto wafers to form semiconductor devices.

Lithographic systems typically used in electron beam pattern generation generate or expose patterns by controlling the flow of energy from a source to a substrate coated with a layer sensitive to that form of energy. Pattern exposure is controlled and partitioned into discrete units commonly referred to as flashes, wherein a flash is that portion of the pattern exposed during one cycle of an exposure sequence. Flashes are produced by allowing energy from the source, for example light, electron or other particle beams, to reach the coated substrate within selected pattern areas. The details of flash composition, dose and exposure sequence used to produce a pattern, and hence the control of the lithographic system, define what is known as a writing strategy.

In a typical vector scan writing strategy, the beam is positioned only over those sites that require exposure and then unblanked to expose the site ("flash"). Positioning is accomplished by a combination of substrate stage and beam movement in what is often referred to as a semi-random scan. Thus, pattern data must be provided that includes both the dose and position of each flash or site exposed. Frequently, vector scan strategies use a variable shaped beam, that is a beam capable of having a different size and/or shape (in terms of cross section) for each flash. The pattern is then composed from these variable shapes, called primitives. A shaped beam is capable of exposing a so called primitive. Where a variable shaped beam is used, the data additionally includes the location, size and shape for each flash.

The typical vector scan process decomposes patterns into rectangular shaped primitives. These rectangles are aligned along the x-y axes defining the vector scan. Thus for example in the pattern depicted in FIG. 1, using a typical vector scan process, only five sub-patterns are true rectangles while the other 62 sub-patterns are triangles approximated by multiple small rectangles. As shown in the example, in a conventional vector scan process, while only 17% of the pattern consists of slanted lines, patterning the slanted lines, i.e., sides not parallel to the x-y vector scan grid, using the rectangle approximations takes approximately 90% of the exposure time.

Techniques to generate shaped beams using multiple openings defined in a single aperture are described in, e.g., page 3814 of "Multielectron Beam Blanking Aperture Array System SYNAPSE 2000" by Hiroshi Yasuda, Soichiro Arai, Ju-ichi Kai, Yoshihisa Ooae, Tomohiko Abe, Shigeru Maruyama, and Takashi Kiuchi, J. Vac. Sci. Tech. Bulletin 14(6), November/December 1996; and page 185 of "A High Speed EBL Column Designed to Minimize Beam Interactions" by Lee Veneklasen, J. Vac. Sci. Tech. B3(1), January/February 1985. However, use of an opening, among multiple openings in a single aperture plane, requires deflection of an incident charged particle beam by a large angle. The larger the angle of beam deflection, the more errors that are introduced in beam positioning, and the larger the errors in beam shaping. Further, the larger the required deflection angle, the slower the throughput.

Thus what is needed is a beam shaping system capable of patterning non-rectangular primitives with a reduced number of flashes and lower deflection angles to increase throughput of patterns having non-orthogonal sides.

SUMMARY

An embodiment of the present invention includes a charged particle beam column for generating a variable shaped charged particle beam, the charged particle beam column including: a source of the charged particle beam; a first aperture defining a first opening positioned coaxial to the beam and spaced apart from the source; a second aperture defining a second opening positioned coaxial to the beam and spaced apart from the first aperture; a third aperture defining a third opening positioned coaxial to the beam and spaced apart from the second aperture; an imaging device coaxial to the beam, where the imaging device controls focusing of the beam; and at least two deflection devices coaxial to the beam which controls a path of the beam through the openings.

Thereby an embodiment of the present invention includes a method for shaping a charged particle beam, the method including the acts of: generating a charged particle beam; shaping the charged particle beam through a first opening; shaping the charged particle beam through a second opening; and shaping the charged particle beam through a third opening.

The present invention will be more fully understood in light of the following detailed description taken together with the accompanying drawings.

BRIEF DESCRIPTION OF DRAWINGS

Note that use of the same reference numbers in different figures indicates the same or like elements.

DETAILED DESCRIPTION

Beam Column

An embodiment of the present invention includes an electron beam column 200A (shown schematically in a side view in FIG. 2A) that uses shaping apertures to generate electron (or other charged particle) beam cross sections having at least 3 approximately straight sides. In this embodiment, each shaping aperture defines a circular opening. In other embodiments, as discussed in more detail below, each aperture defines an opening having at least 3 straight sides.

Figure 2A:
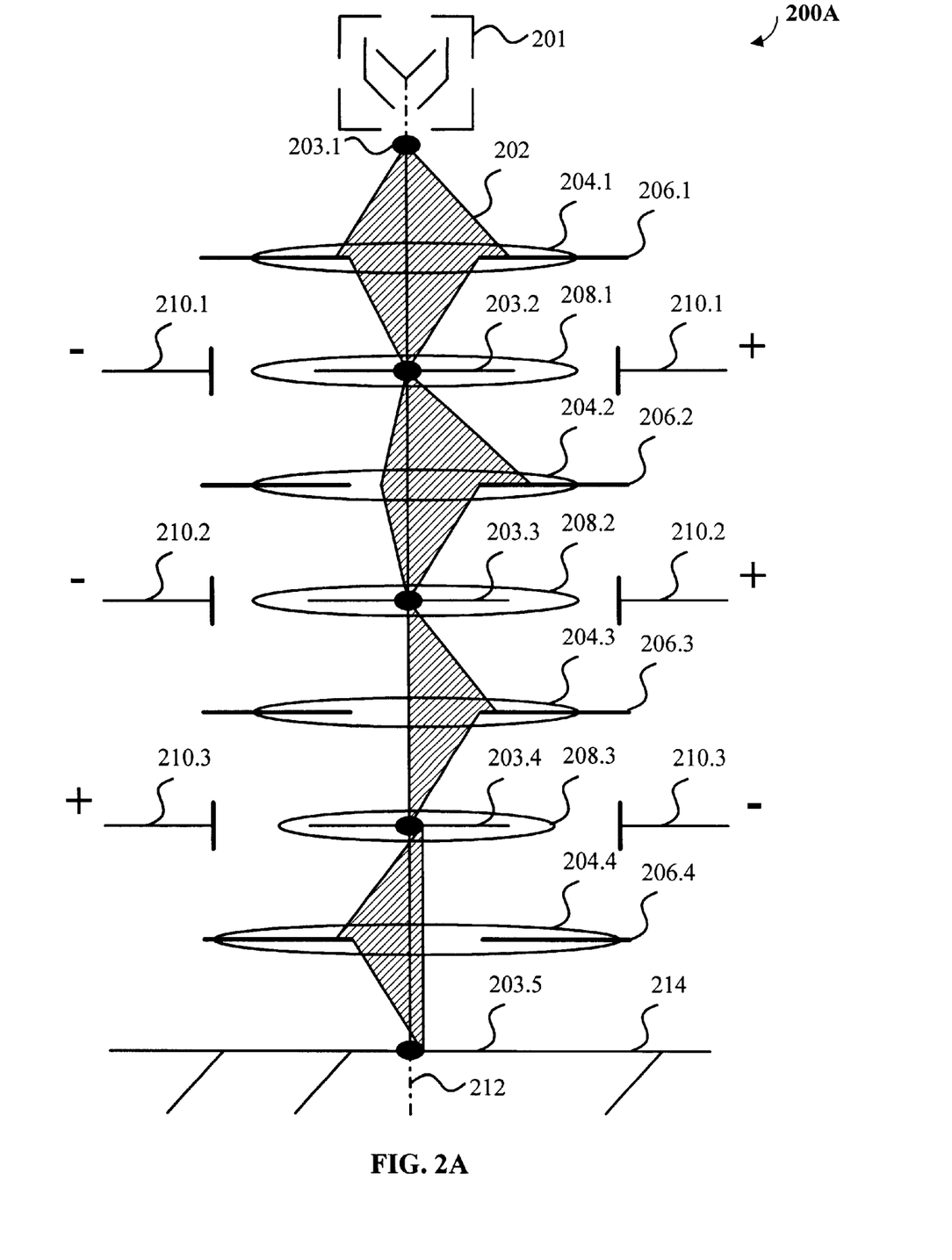
FIGS. 2A to 2C depict schematically respective beam columns 200A to 200C in accordance with embodiments of the present invention.

Electron beam column 200 includes a conventional electron beam source 201 that outputs an electron beam 202 having a circular shaped cross section, whereby the combination of the first aperture 206.1, a second aperture 206.2, a third aperture 206.3, and a fourth aperture 206.4 shapes the cross section of electron beam 202. The direction of the electron beam 202 through the shaping apertures is controlled by a combination of: a conventional first deflector 210.1, a conventional second deflector 210.2, and a conventional third deflector 210.3. The following components control the focusing of the cross section of electron beam 202: a conventional first field lens 204.1, a conventional first transfer lens 208.1, a conventional second field lens 204.2, a conventional second transfer lens 208.2, a conventional third field lens 204.3, a conventional third transfer lens 208.3, and a conventional fourth field lens 204.4.

The electron beam source 201 outputs electron beam 202 having a circular cross section. Crossover point 203.1 represents the gun crossover point of electron beam 202.

Figure 3A:
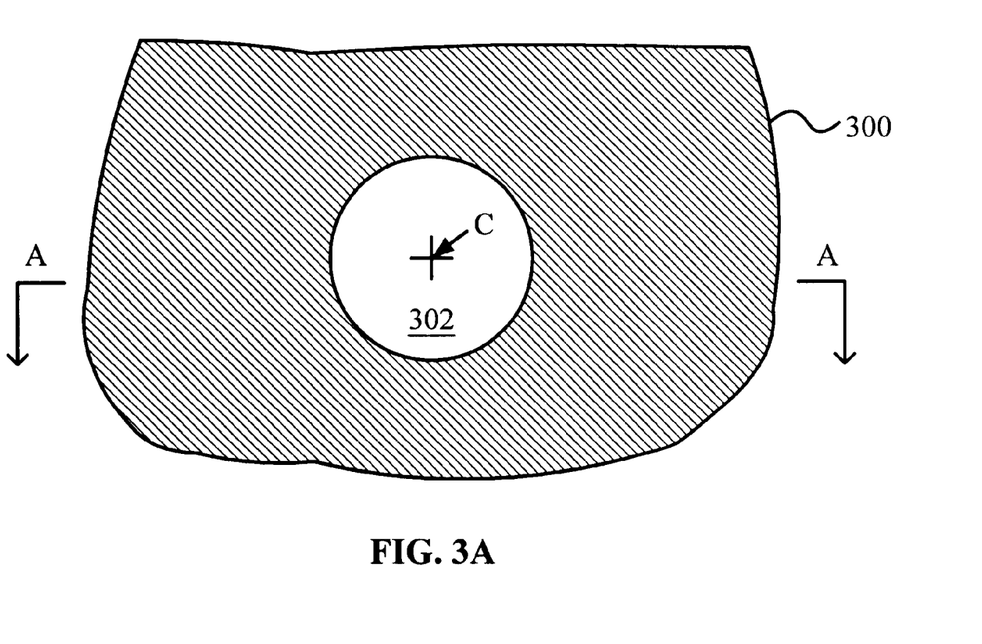
FIG. 3A depicts a planar view of aperture 300 that defines opening 302.
Figure 3B:
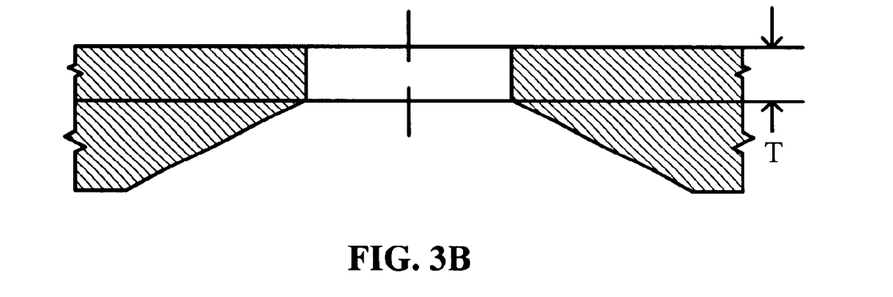
FIG. 3B depicts a cross sectional view of first aperture 300 along line A—A of FIG. 3A.

First aperture 206.1 is positioned below electron beam source 201. (Herein "below" means downstream with regard to the electron beam direction from beam source 201.) An implementation of first aperture 206.1 is depicted in FIG. 3A as aperture 300, which defines a circular opening 302. FIG. 3B depicts a cross sectional view of aperture 300 along line A—A of FIG. 3A. An equation describing a size of opening 302 is provided later.

Referring to FIG. 3A, a suitable conventional technique to fabricate the first aperture 206.1 is as follows. A top surface of a silicon wafer is covered with resist except for an exposed circular region defined by lithography. The top surface is etched to define a corresponding circular opening in the top surface. A bottom surface of the wafer, opposite the top surface is then covered with resist except for a circular region opposite the etched circular opening and having a same diameter. The bottom surface is etched to define a corresponding circular opening in the bottom surface. Thereby a circular opening, that corresponds to circular opening 302, is etched entirely through the silicon wafer.

The conventional first field lens 204.1 is positioned within the same plane as first aperture 206.1. First field lens 204.1 focuses the gun crossover point 203.1 onto crossover plane 203.2 and axially aligned with ray 212 that extends between the center of the openings defined in first aperture 206.1 and second aperture 206.2. Crossover plane 203.2 is midway between the planes of first aperture 206.1 and second aperture 206.2. A suitable implementation of first field lens 204.1 is an electron or non-beam lens.

The conventional first deflector 210.1 is positioned within the plane of crossover plane 203.2 and below first field lens 208.1. When a voltage or current is applied to first deflector 210.1, first deflector 210.1 generates a two dimensional field which deflects the path of electron beam 202 towards second aperture 206.2 and controls where electron beam 202 impinges second aperture 206.2.

The conventional first transfer lens 208.1 is positioned within the plane of crossover plane 203.2. First transfer lens 208.1 focuses the beam cross section as shaped by first aperture 206.1 onto the plane of second aperture 206.2. A suitable implementation of first transfer lens 208.1 is an electron or non-beam lens.

Second aperture 206.2 is positioned below first transfer lens 208.1. Second aperture 206.2 is similar to first aperture 206.1.

The conventional second field lens 204.2 is positioned within the same plane as second aperture 206.2. Second field lens 204.2 focuses the image from crossover plane 203.2 onto crossover plane 203.3 and axially aligned with ray 212 that extends between the center of the openings defined in second aperture 206.2 and third aperture 206.3. Crossover plane 203.3 is midway between the planes of second aperture 206.2 and third aperture 206.3. A suitable implementation of second field lens 204.2 is similar to first field lens 204.1.

The conventional second deflector 210.2 is positioned within the plane of crossover plane 203.3 and below second field lens 204.2. When a voltage or current is applied to second deflector 210.2, second deflector 210.2 generates a two dimensional field which deflects the path of electron beam 202 towards third aperture 206.3 and controls where electron beam 202 impinges third aperture 206.3.

The conventional second transfer lens 208.2 is positioned within the plane of crossover plane 203.3. Second transfer lens 208.2 focuses the cross section of beam 202, shaped by first aperture 206.1 and optionally by second aperture 206.2, onto the plane of third aperture 206.3. A suitable implementation of second transfer lens 208.2 is similar to first transfer lens 208.1.

Third aperture 206.3 is positioned below second transfer lens 208.2. Third aperture 206.3 is similar to first aperture 206.1.

The conventional third field lens 204.3 is positioned within the same plane as third aperture 206.3. Third field lens 204.3 focuses the image from crossover plane 203.3 onto crossover plane 203.4 and axially aligned with ray 212 that extends between the center of the openings defined in third aperture 206.3 and fourth aperture 206.4. Crossover plane 203.4 is midway between the planes of third aperture 206.3 and fourth aperture 206.4. A suitable implementation of third field lens 204.3 is similar to first field lens 204.1.

The conventional third deflector 210.3 is positioned within the plane of crossover plane 203.4 and below third field lens 204.3. When a voltage or current is applied to third deflector 210.3, third deflector 210.3 generates a two dimensional field which controls the path of electron beam 202 towards fourth aperture 206.4 and controls where electron beam 202 impinges fourth aperture 206.4.

The conventional third transfer lens 208.3 is positioned within the plane of crossover plane 203.4. Third transfer lens 208.3 focuses the cross section of beam 202, shaped by first aperture 206.1, optionally by second aperture 206.2, and optionally by third aperture 206.3, onto the plane of fourth aperture 206.4. A suitable implementation of third transfer lens 208.3 is similar to first transfer lens 208.1.

Fourth aperture 206.4 is positioned below third transfer lens 208.3. Fourth aperture 206.4 is similar to first aperture 206.1.

The conventional fourth field lens 206.4 is positioned within the same plane as fourth aperture 206.4. Fourth field lens 206.4 focuses the image from crossover plane 203.4 onto crossover plane 203.5, which coincides with a surface of substrate 214, and along a ray 212 that extends between through the centers of the openings defined in first aperture 206.1 to fourth aperture 206.4. A suitable implementation of third field lens 204.3 is similar to first field lens 204.1.

In this embodiment, the centers of the openings (point C shown in FIG. 3A) of first aperture 206.1, second aperture 206.2, third aperture 206.3, and fourth aperture 206.4 are aligned along axis 212 descending from electron beam source 201.

Second Beam Column

Figure 2B:
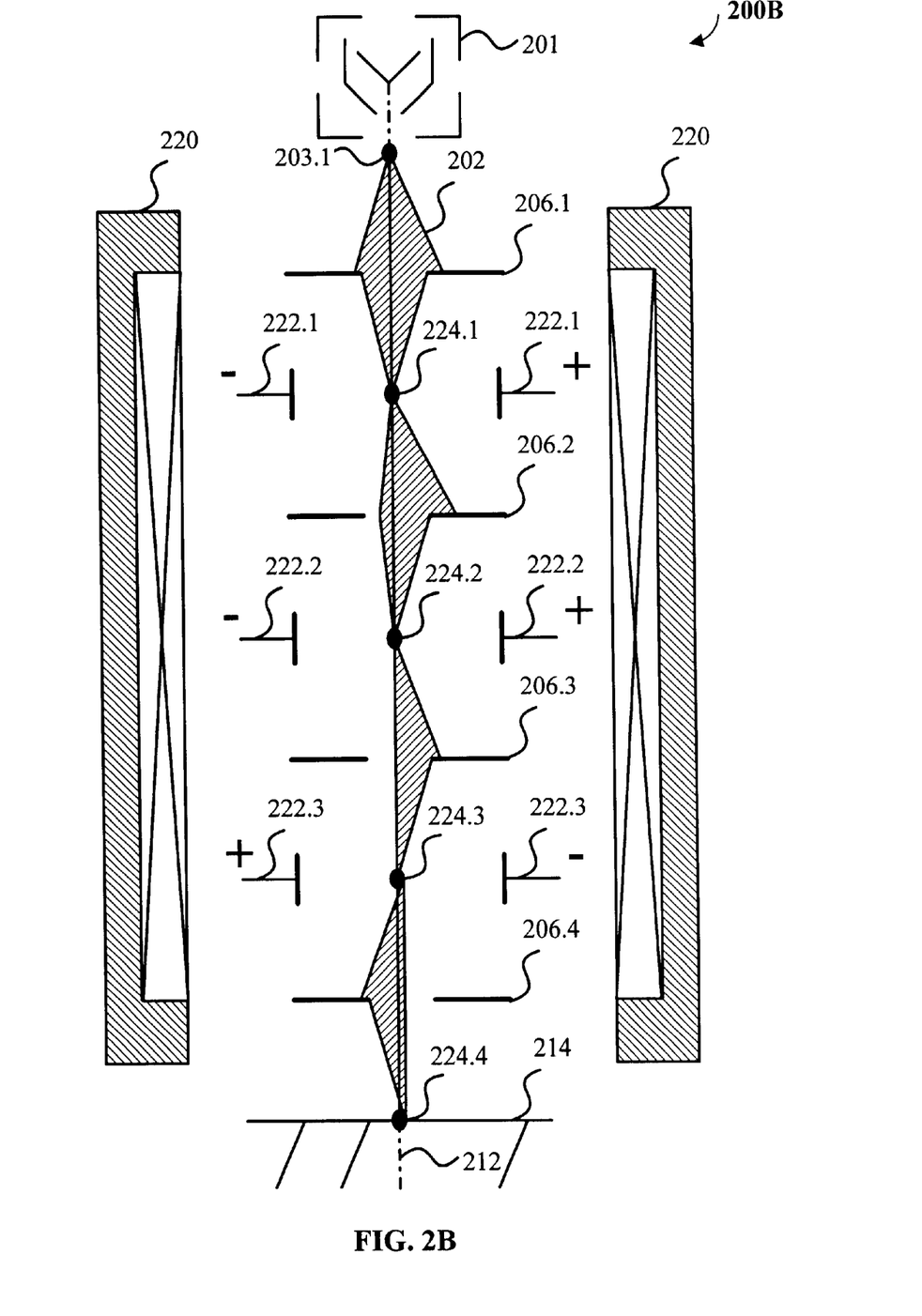

FIG. 2B schematically depicts a side view of beam column 200B, in accordance with a second embodiment of the present invention. Like beam column 200A, beam column 200B includes a conventional electron beam source 201 that outputs an electron (or other charged particle) beam 202 having a circular shaped cross section, whereby first aperture 206.1, a second aperture 206.2, a third aperture 206.3, and a fourth aperture 206.4 shape the cross section of electron beam 202. The direction of the electron beam 202 through the shaping apertures is controlled by the combination of conventional first deflector 222.1, a conventional second deflector 222.2, and a conventional third deflector 222.3. Solenoid lens 220, which controls the focusing of the cross section of electron beam 202, surrounds both the shaping apertures and the deflectors 222.1 to 222.3.

First aperture 206.1, second aperture 206.2, third aperture 206.3, and fourth aperture 206.4 are similar to the apertures having the same reference numbers as described above with respect to beam column 200A. First deflector 222.1, second deflector 222.2, and third deflector 222.3 are similar to respective first deflector 210.1, second deflector 210.2, and third deflector 210.3 described above. The apertures and the deflectors of the beam column 200B are arranged similarly as within beam column 200A.

In this embodiment, the solenoid lens 220 performs similar functions as the combination of first field lens 204.1, first transfer lens 208.1, second field lens 204.2, second transfer lens 208.2, third field lens 204.3, third transfer lens 208.3, and fourth field lens 204.4, described earlier with respect to beam column 200A of FIG. 2A. Thus solenoid lens 220 focuses the image from gun crossover point 203.1 onto crossover point 224.1 (located midway between first aperture 206.1 and second aperture 206.2), focuses the image at crossover point 224.1 onto crossover point 224.2 (located midway between second aperture 206.2 and third aperture 206.3), focuses the image at crossover point 224.2 onto crossover point 224.3 (located midway between third aperture 206.3 and fourth aperture 206.4), and focuses the image at crossover point 224.3 on crossover point 224.4, the surface of substrate 214. Solenoid lens 220 also focuses the image shaped by first aperture 206.1 onto the plane of second aperture 206.2, focuses the image shaped by second aperture 206.2 onto the plane of third aperture 206.3, and focuses the image shaped by the third aperture 206.3 onto the plane of fourth aperture 206.4.

Figure 2C:
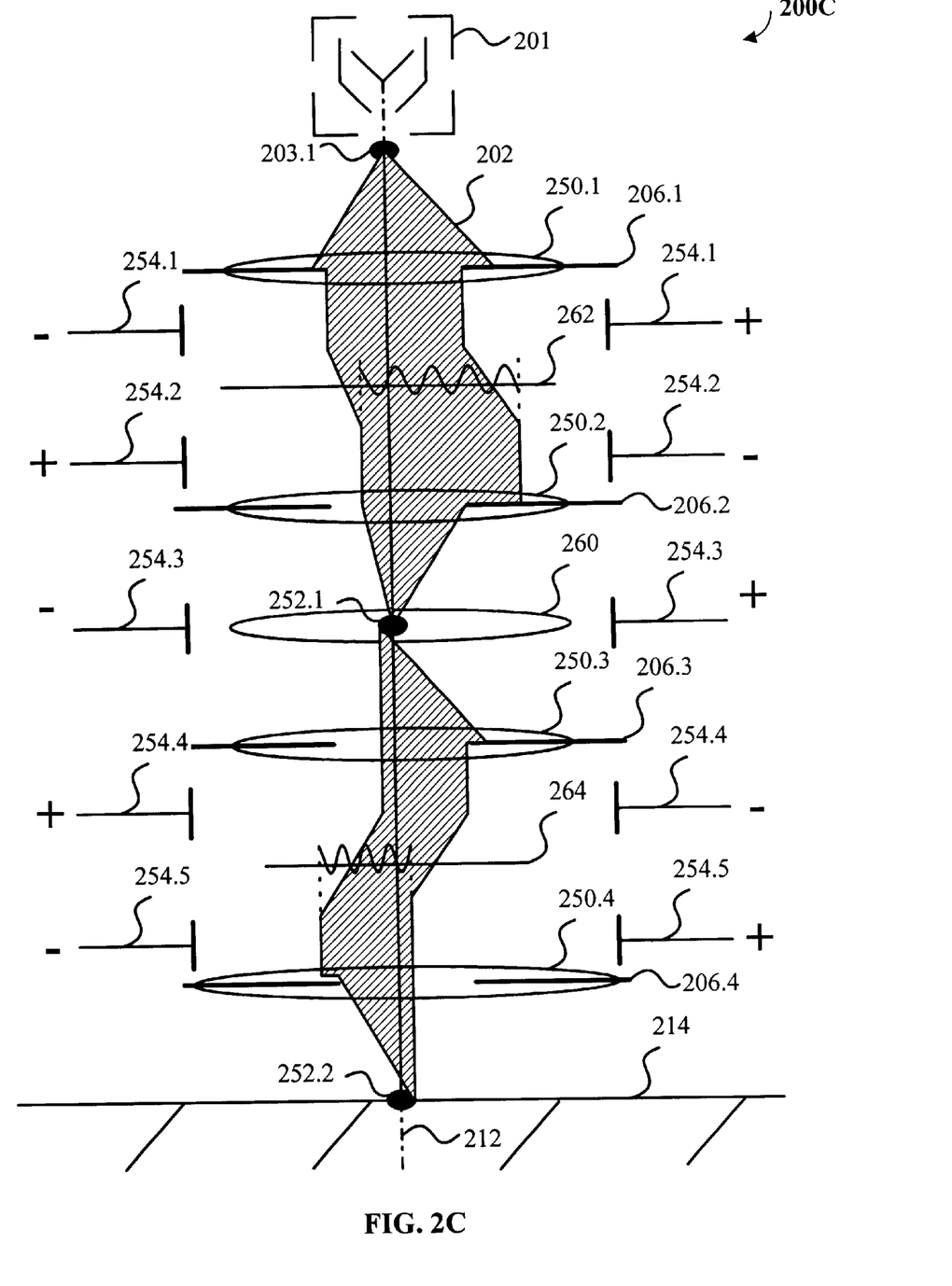
Figure 2D:
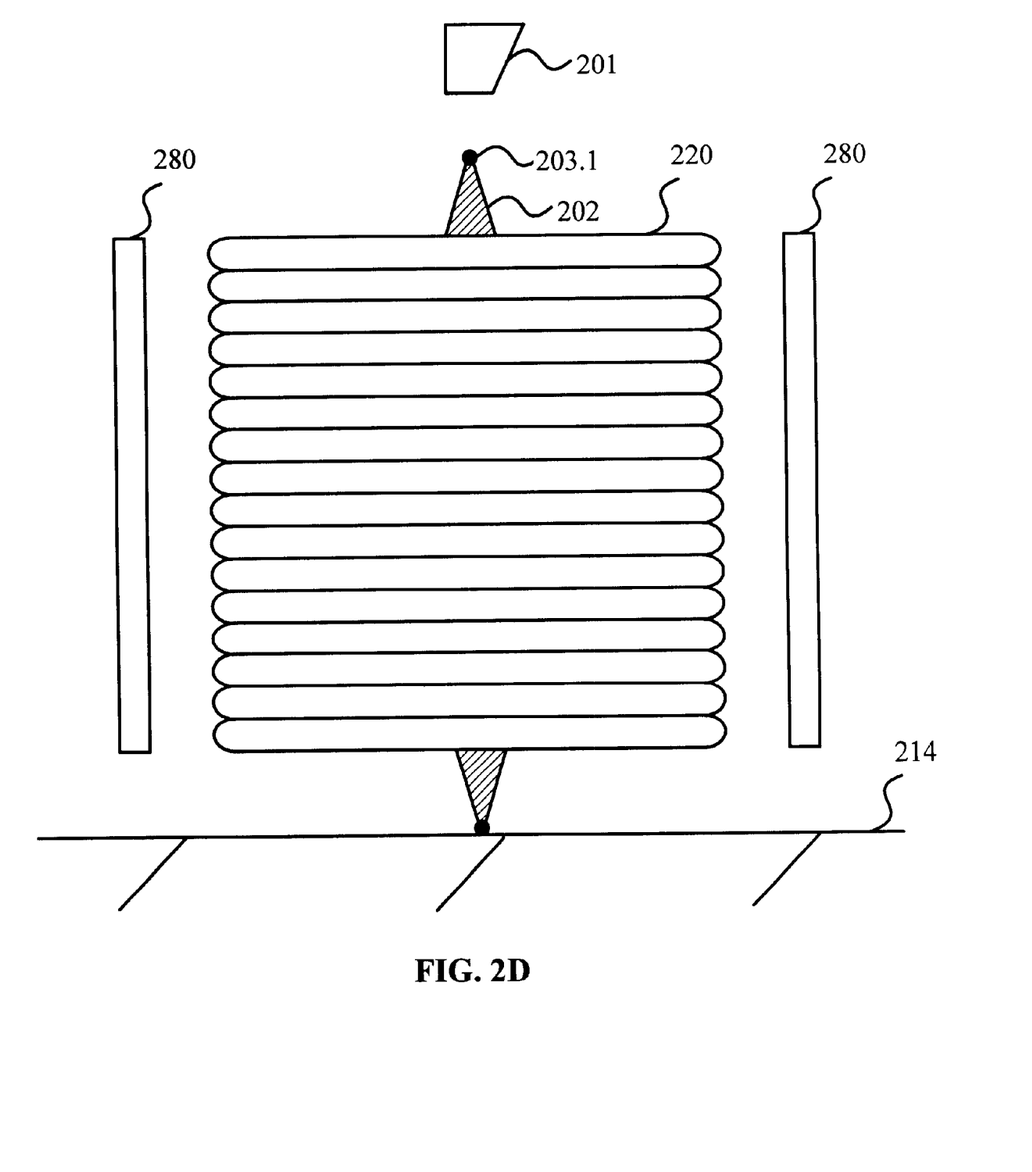
FIG. 2D depicts a solenoid lens suitable for use in an embodiment of the present invention.

A suitable implementation of solenoid lens 220 is a conventional solenoid coil, such as depicted in FIG. 2D. In one embodiment, the solenoid coil is enclosed by a cylindrical pipe (shown in cross section as 280), positioned coaxial with the beam 202, to confine the solenoid coil's magnetic field. A suitable material of cylindrical pipe 280 is, e.g., iron. When a constant (D.C.) current is applied to the coils of the solenoid lens 220, solenoid lens 220 generates a uniform magnetic field (not depicted), according to the principles of the well known Bio-Savart Law, which effectively deflects any electrons which stray from ray 212 to travel along ray 212. The current level through the solenoid is set to achieve beam focusing at crossover point 224.4. Such a current further focuses the beam throughout beam column 200B as specified above. Thus beam column 200B allows for convenient beam image focusing without the use of separate lens elements.

The separate lens elements of beam column 200A are less compact than solenoid lens 220, and thus solenoid lens 220 allows for beam column 200B to be more compact than beam column 200A. Consequently, beam column 200B incurs less image distortion caused by electron-electron interactions. Beam column 200B is also likely to be of lower cost than the combination of lenses of beam column 200A.

Third Beam Column

FIG. 2C schematically depicts a side view of beam column 200C, in accordance with a third embodiment of the present invention. Similar to beam columns 200A and 200B, beam column 200C includes a conventional electron beam source 201 that outputs an electron beam 202 having a circular shaped cross section, whereby first aperture 206.1, a second aperture 206.2, a third aperture 206.3, and a fourth aperture 206.4 shape the cross section of electron beam 202. The direction of the electron beam 202 through the shaping apertures is controlled by a combination of conventional deflectors 254.1 to 254.5. The focusing of the beam image, i.e., cross section, of electron beam 202 is controlled by a combination of field lenses 250.1 to 250.4 and transfer lens 260.

Both the first field lens 250.1 and first aperture 206.1 are positioned below source 201. Deflectors 254.1 and 254.2, both positioned below first field lens 250.1 and first aperture 206.1, separately deflect the direction of beam 202 from first aperture 206.1 and thereby control a location on second aperture 206.2 that beam 202 impinges. The second field lens 250.2 and second aperture 206.2 are positioned below deflector 254.2. The combination of first field lens 250.1 and second field lens 250.2 focus an image of the gun crossover point 203.1 onto the plane of the transfer lens 260. The arrangement of first field lens 250.1, second field lens 250.2, and deflectors 254.1 and 254.2, relative to two shaping apertures, is conventional.

Transfer lens 260 focuses a cross section of beam 202 defined by the openings of the apertures 206.1 and 206.2, located within the object plane 262, onto plane 264. Object plane 262 is located midway between the planes of first aperture 206.1 and 206.2. Plane 264 is located midway between the planes of third aperture 206.3 and fourth aperture 206.4.

Deflector 254.3, positioned within the same plane as transfer lens 260, controls the direction of beam 202 from second aperture 206.2 and thereby controls a location on third aperture 206.3 that beam 202 impinges.

Third field lens 250.3 and third aperture 206.3 are positioned below transfer lens 260. Deflectors 254.4 and 254.5, both positioned below third field lens 250.3 and third aperture 206.3, separately deflect the direction of beam 202 from third aperture 206.3 and thereby control a location on fourth aperture 206.4 that beam 202 impinges. The fourth field lens 250.4 and fourth aperture 206.4 are positioned below deflector 254.5. The combination of third field lens 250.3 and fourth field lens 250.4 focus an image of beam 202, located at crossover plane 252.1, onto crossover plane 252.2, the surface of substrate 214.

The final cross sectional shape of beam 202 at crossover plane 252.2 is effectively a shadow formed by overlap of openings of apertures 206.1, 206.2, 206.3, and 206.4.

First aperture 206.1, second aperture 206.2, third aperture 206.3, and fourth aperture 206.4 are aligned by axis 212 descending from electron beam source 201 through crossover point C shown in FIG. 3A.

Comparison of Beam Columns

By comparison, in beam column 200C, electron beam 202 is not focused within the plane of any aperture. Thus, the cross section of electron beam 202 within each aperture plane of beam column 200C is likely blurred. Consequently, each aperture of beam column 200C creates a shadow projection with a blurred cross section. In beam columns 200A and 200B, the beam 202 is focused within at least the planes of apertures 206.2 to 206.4. Consequently, beam columns 200A and 200B more accurately shape beam images than does beam column 200C. However, beam column 200A is longer than beam column 200C and consequently incurs more electron-electron interactions, which blur the shaped electron beam on a target substrate. Beam column 200B is more compact than beam column 200A and thereby incurs less image blur due to electron-electron interactions than beam column 200A because single solenoid lens 220 is more compact than separate field and transfer lenses of beam column 200A.

Size of Circular Shaped Aperture Openings

Figure 4A:
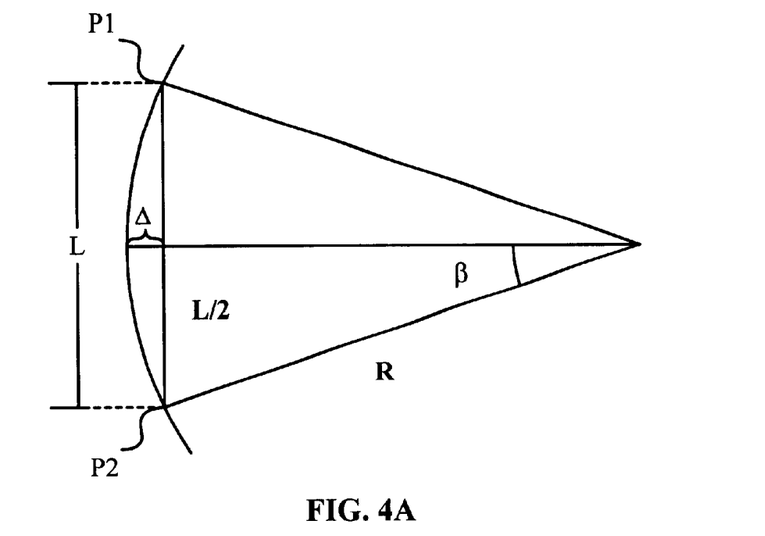
FIG. 4A depicts a relationship between a length, L, of a desired line, a radius, R, of a circular opening, and a tolerable error, $\Delta$.

A description of an equation describing a radius of the circular openings defined in apertures 206.1 to 206.4 follows. The following geometric equation, whose variables are illustrated in FIG. 4A, describes a relationship between a length, L, of a desired line, a radius, R, of a circular opening, and a tolerable error, $\Delta$, measured in terms of a farthest distance between the line having length L that intersects two points (P1 and P2) of the circular opening:

$$R \geq \frac{M(4\Delta^2 + L^2)}{8\Delta}$$

where M is the magnification factor, which is the ratio of the size of the image at crossover plane 203.5 to the size at gun crossover point 203.1.

Example Shaping Sequence

Figure 5:
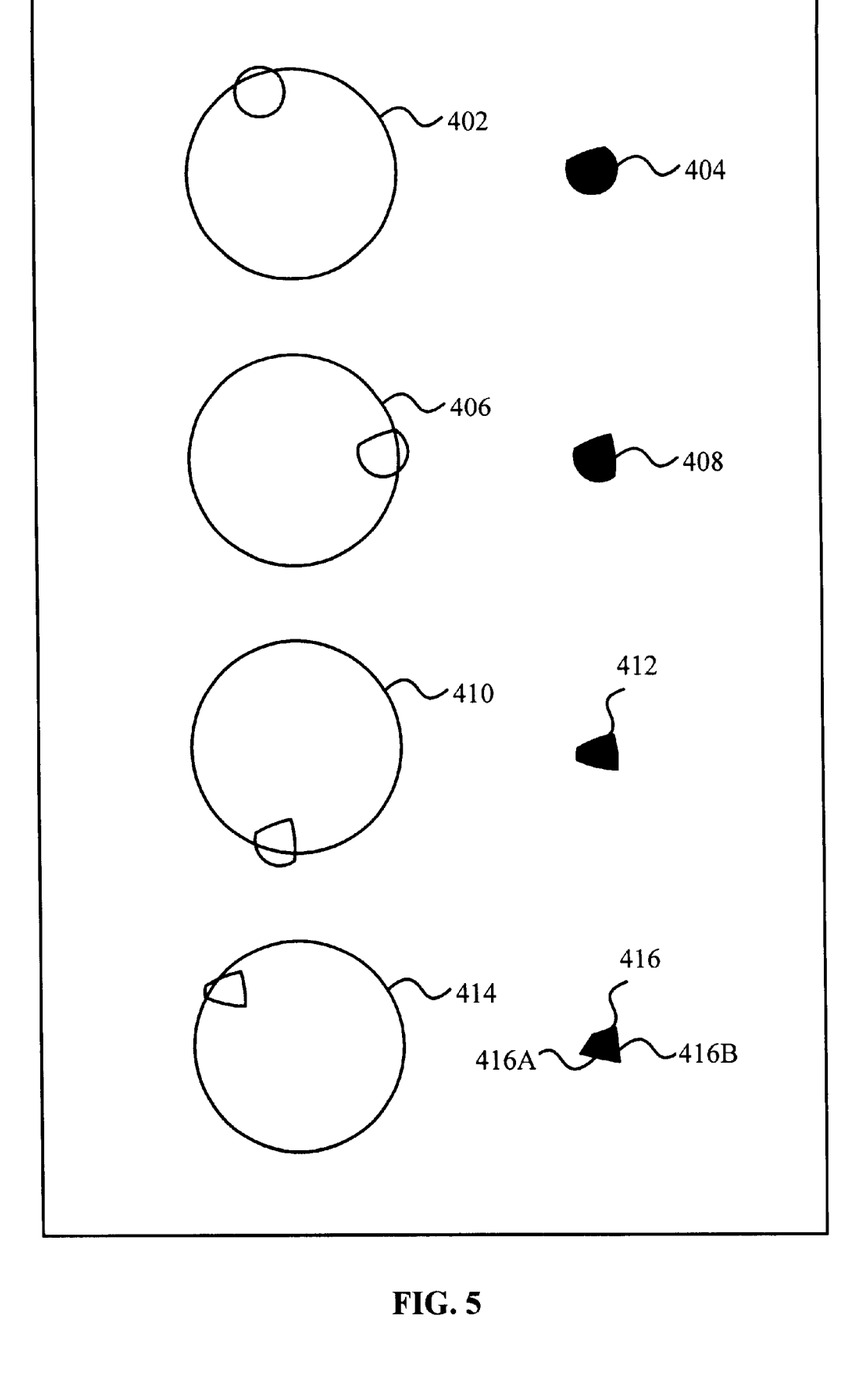
FIG. 5 depicts an example of a shaping of the image of beam 202 by a combination of first aperture 206.1, second aperture 206.2, third aperture 206.3, and fourth aperture 206.4.

The following describes an exemplary operation of beam columns 200A to 200C . FIG. 5 depicts in a plan view an example of shaping of the image of beam 202 by a combination of first aperture 206.1, second aperture 206.2, third aperture 206.3, and fourth aperture 206.4. Electron beam source 201 outputs circular shaped electron beam 202. Electron beam intersects first aperture 206.1, as shown at 402, to shape the image of beam 202, as shown at 404. At 402, the large circle is the aperture and the smaller circle is the image of beam 202.

Next, first deflector 210.1, 222.1, or 254.1 and 254.2 together, located above second aperture 206.2, changes the direction of electron beam 202 so that electron beam intersects second aperture 206.2 as shown at 406 to shape the image of beam 202 as shown at 408.

Next, second deflector 210.2, 222.2, or 254.3, located above third aperture 206.3, changes the direction of electron beam 202 so that the image of beam 202 intersects third aperture 206.3 as shown at 410 to shape the image of beam 202 as shown at 412.

Next, third deflector 210.3, 222.3, or 254.4 and 254.5 together, located above fourth aperture 206.4, changes the direction of electron beam 202 so that the image of beam 202 intersects fourth aperture 206.4, shown at 414, to shape the image of beam 202, shown at 416. In this example, the final shape of the image of beam 202 is shown at 416.

Thus beam columns 200A to 200C generate variable shaped electron beams with a cross section having at least 3 approximately linear sides, shown as 416A and 416B for example. The sides are only approximately linear because the circular openings shape the electron beam 202. A shaped side becomes more linear the larger the diameter of the circular opening is relative to the diameter of the electron beam 202 cross section.

Figure 1:
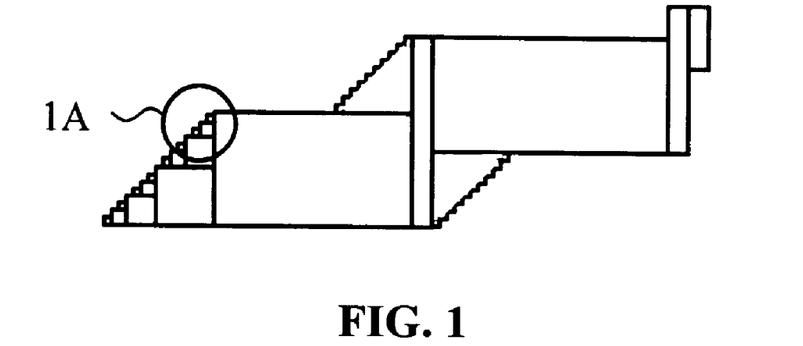
FIG. 1 depicts a pattern represented as rectangular shaped primitives in a conventional vector scan writing strategy.
Figure 1A:
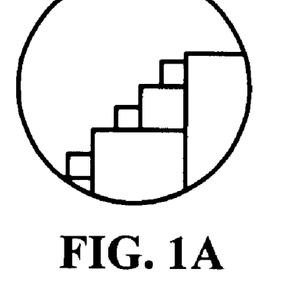
Figure 6:
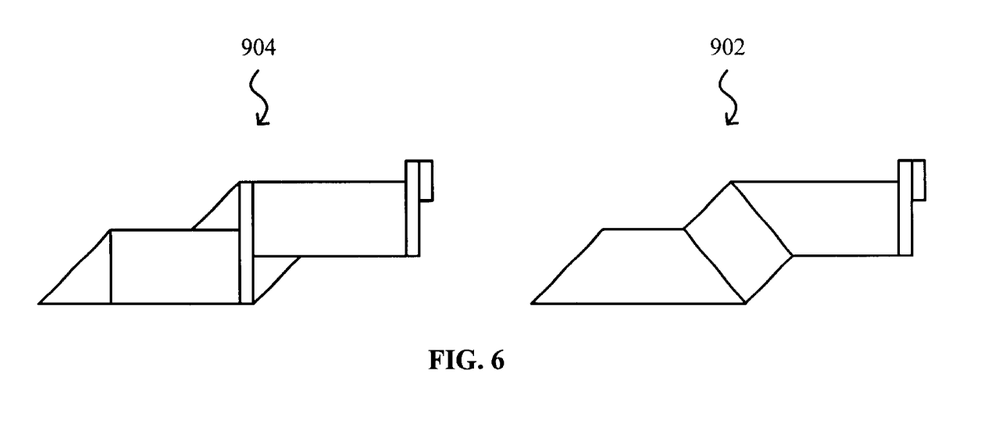
FIG. 6 depicts a patterns 902 and 904 consisting of primitives generated by either of beam columns 200A to 200C.

FIG. 6 depicts patterns 902 and 904 consisting of primitives generated by either of beam columns 200A to 200C . By comparison, for pattern 902, 5 flashes are required by use of either of beam columns 200A to 200C as opposed to 62 flashes required by use of the prior art variable shape beam system (FIG. 1). Pattern 904 requires 8 flashes.

Other Opening Shapes Defined By the Apertures

Figure 4B:
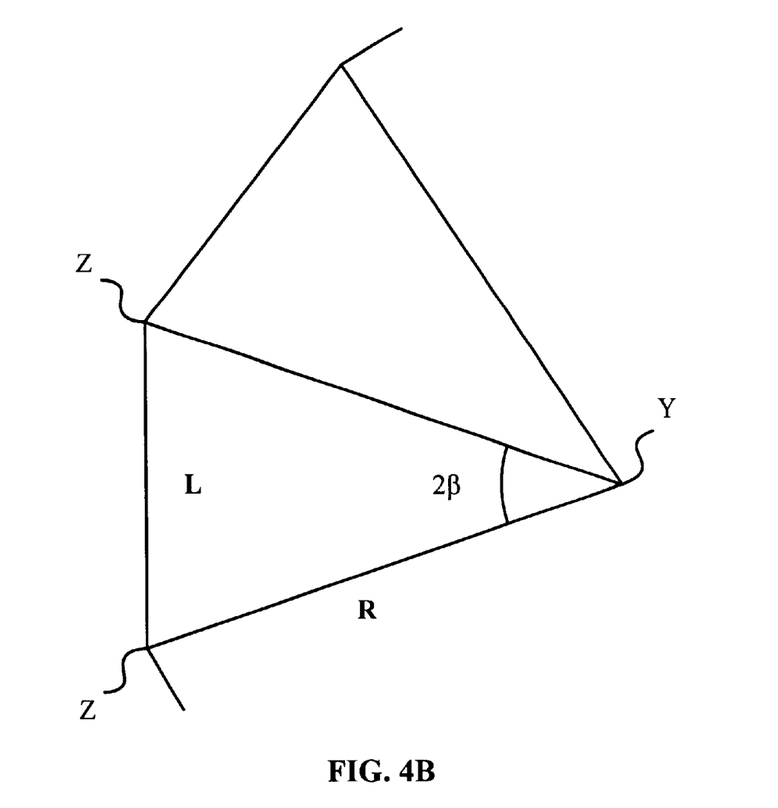
FIG. 4B depicts a relationship between distance, R, from the center of an opening to a corner Z, and length, L, of a side of an opening.

For aperture openings having at least 3 straight sides of equal length, the following equation, whose variables are illustrated in FIG. 4B, represents a relationship between distance R, measured from the center of an aperture opening to a corner Z, and length, L, of a side of an aperture opening.

$$R = \frac{ML}{2\sin(180°/N)}$$

where

N is a number of sides of the opening, i.e., $360°/2\beta$;

$\beta$ is half the angle between two adjacent corners Z—Z with respect to the center of the opening, Y; and M is the magnification described earlier with respect to FIG. 4A.

The length L is greater than or equal to a maximum desired cross sectional side length of beam 202.

For example, for a square shaped opening, $2\beta=90°$ and thus R must be greater than or equal to 0.41 ML.

Note that the angle between adjacent sides of a beam cross section depends on the number of shaping apertures, a number of straight sides of an opening defined within an aperture, and any angular rotation of between openings. Thus increasing the number of straight sides of each aperture opening decreases possible angles between adjacent sides of a beam cross section. Rotating the aperture openings relative to each other further decreases possible angles between adjacent sides of a beam cross section.

Square Shaped Openings

Figure 7A:
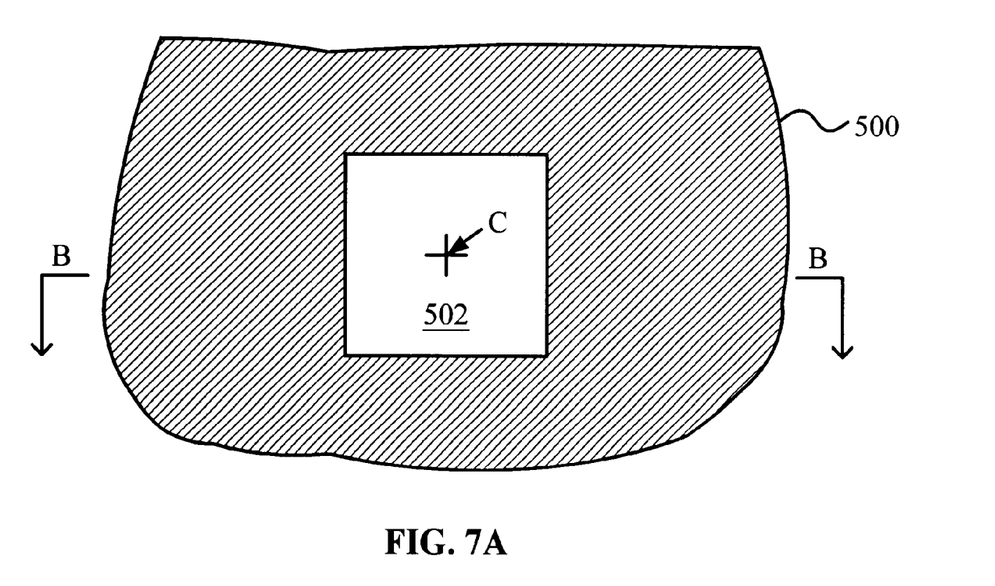
FIG. 7A depicts a planar view of aperture 500 that defines opening 502.
Figure 7B:
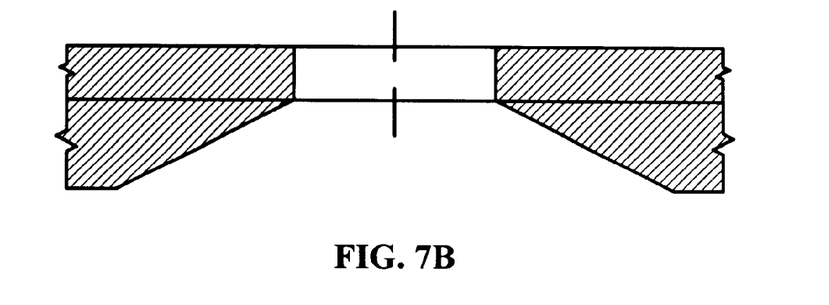
FIG. 7B depicts a cross sectional view of first aperture 500 along line B—B of FIG. 5A.
Figure 8A:
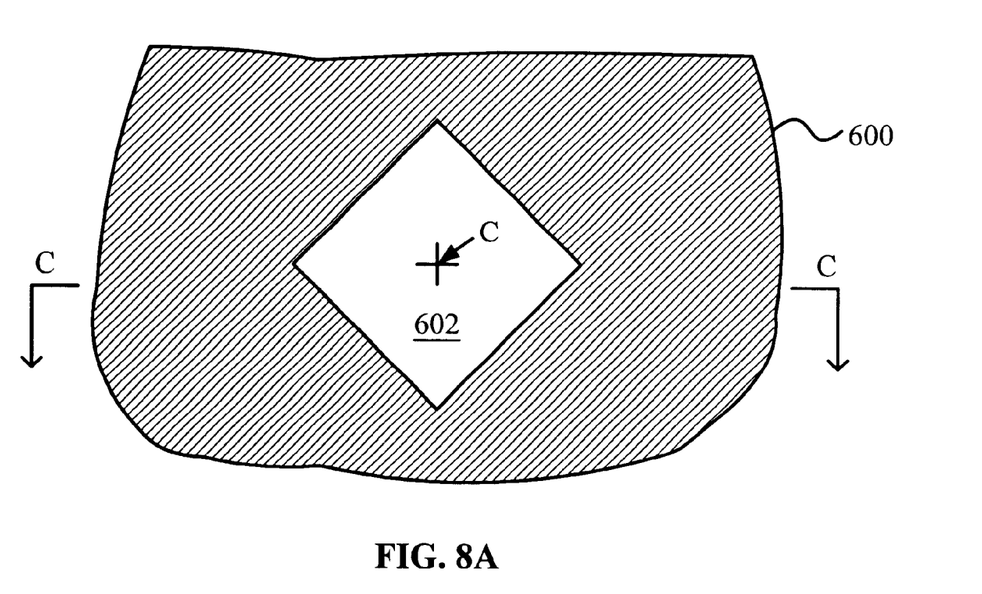
FIG. 8A depicts a planar view of aperture 600 that defines opening 602.
Figure 8B:
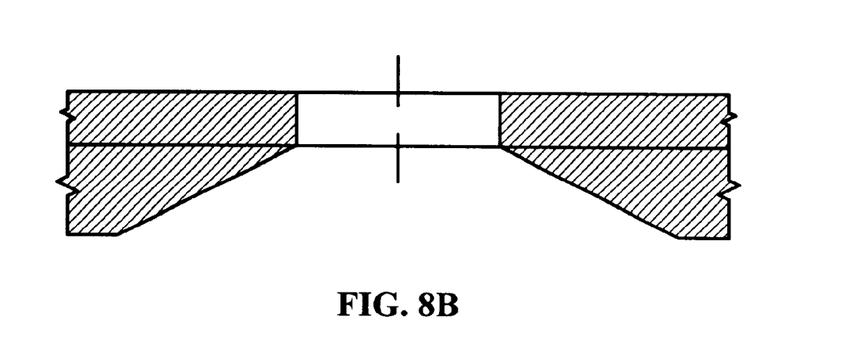
FIG. 8B depicts a cross sectional view of first aperture 600 along line C—C of FIG. 8A.

In an embodiment of the present invention, first aperture 206.1 and second aperture 206.2 each define a square opening shown as opening 502 of aperture 500 (FIGS. 7A and 7B) and third aperture 206.3 and fourth aperture 206.4 each define an opening shown as opening 602 of aperture 600 (FIGS. 8A and 8B). Third aperture 206.3 and fourth aperture 206.4 each define square shaped openings of the same size as the square shaped openings defined by each of first aperture 206.1 and second aperture 206.2 except that the openings defined by third aperture 206.3 and fourth aperture 206.4 are rotated by 45 degrees about crossover point C shown in FIG. 7A relative to the opening 502 of aperture 500. The center crossover points of first aperture 206.1, second aperture 206.2, third aperture 206.3, and fourth aperture 206.4 (shown as C in FIGS. 7A and 8A) are aligned along an axis descending from the electron source 201.

Figure 9A:
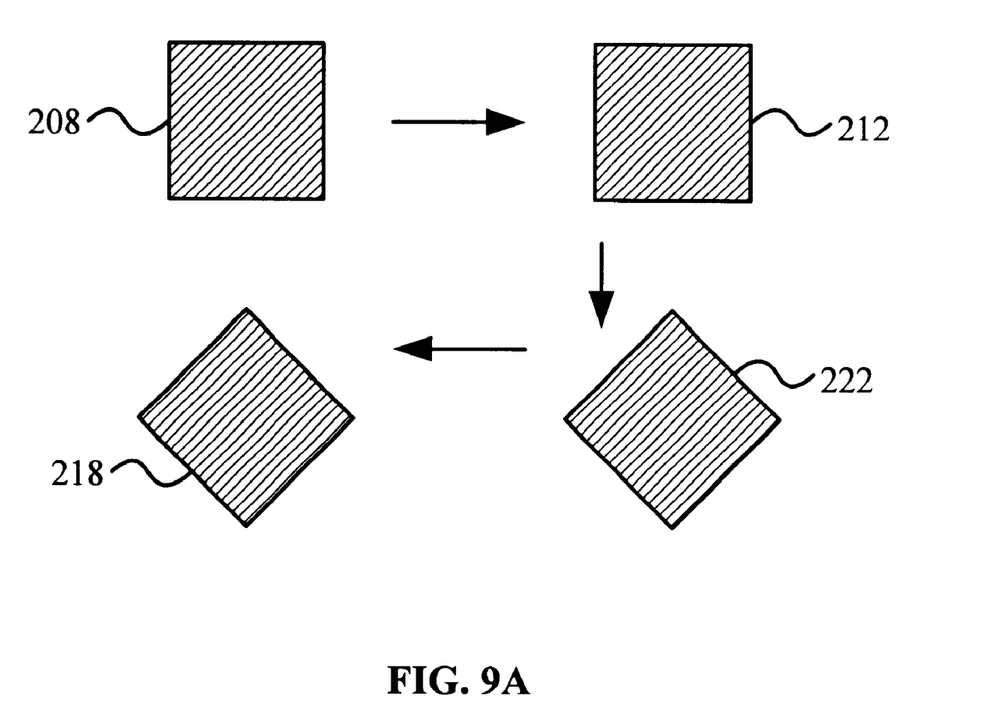
FIG. 9A depicts in plan view the sequence of aperture openings that shape the image of beam 202 in accordance with an embodiment of the present invention.

FIG. 9A depicts in plan view the sequence of aperture openings that shape the image of beam 202 in accordance with this embodiment of the present invention.

Figure 9B:
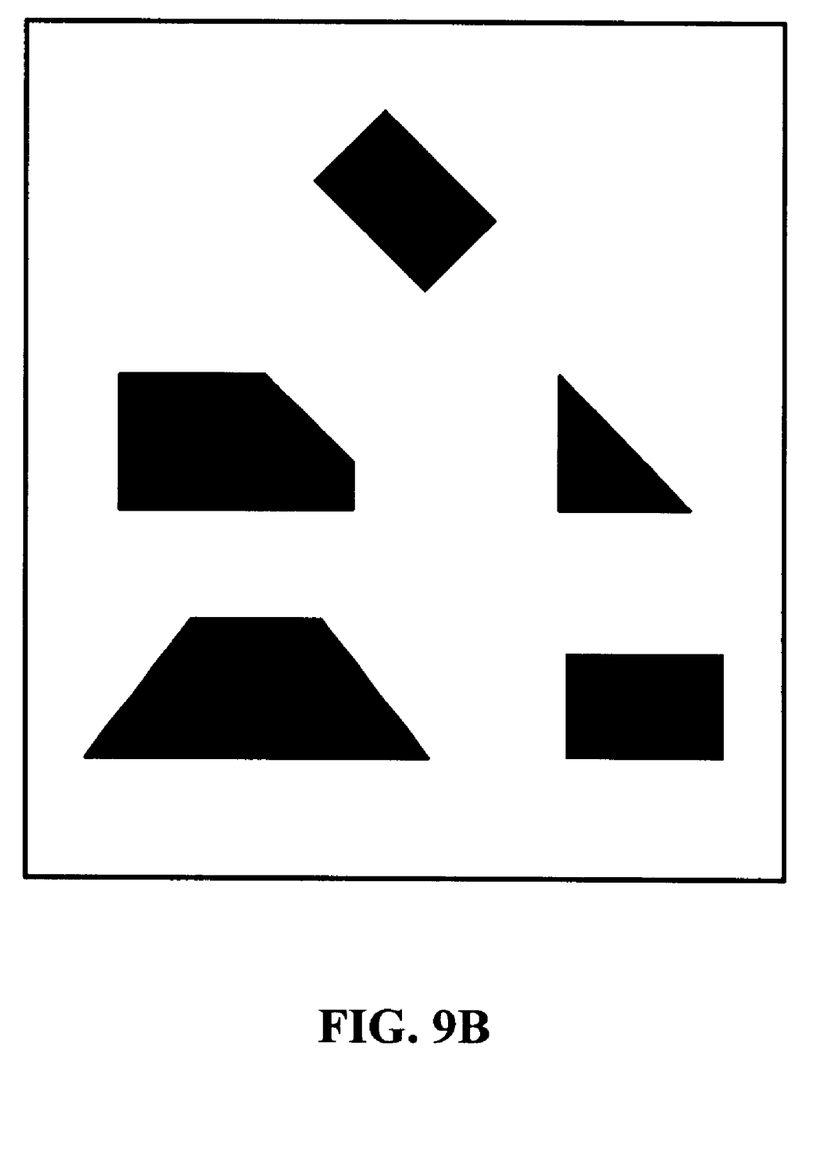
FIG. 9B depicts a sample of beam images shapes created by shaping a beam with the four apertures of FIG. 9A, in accordance with an embodiment of the present invention.

In accordance with this embodiment, FIG. 9B depicts a sample of beam images shapes created by shaping a beam with the aperture openings of FIG. 9A. Thereby this embodiment generates electron beam 202 having a cross section having sides with angles of 0, 45, 90, or 135 degrees to one another, the sides being within the plane of the target.

By contrast, the circular shaped openings allow for more angles between adjacent sides of a beam cross section than the square shaped openings. The square shaped openings allow for limited angles between sides of a beam cross section and therefore introduce errors between desired angles and generated angles. However, the circular shaped openings do not shape beam sides as straight as the square shaped openings.

The above-described embodiments of the present invention are illustrative and not limiting. It will thus be obvious to those skilled in the art that various changes and modifications may be made without departing from this invention in its broader aspects. For example, the number of shaping apertures used can vary, with of course additional or less imaging and deflectors used. The openings defined by each shaping aperture can have three or more sides and can be rotated relative to each other. The openings defined by each shaping aperture need not have symmetrical side lengths. Each shaping aperture need not define the same opening shape. Therefore, the appended claims encompass all such changes and modifications as fall within the true scope of this invention.

What is claimed is:

1. A charged particle beam column for generating a shaped charged particle beam, the charged particle beam column comprising:
   a source of a charged particle beam;
   a first aperture defining a first opening having a first perimeter positioned coaxial to the beam and spaced apart from the source;
   a second aperture defining a second opening having a second perimeter positioned coaxial to the beam and spaced apart from the first aperture;
   a third aperture defining a third opening having a third perimeter positioned coaxial to the beam and spaced apart from the second aperture;
   an imaging device coaxial to the beam wherein the imaging device controls focusing of the beam; and
   at least two deflection devices coaxial to the beam and which control a path of the beam through the openings such that the beam passing through each opening intersects only a portion less than the entire perimeter corresponding to at least one of the apertures thereby shaping the beam according to the portion of the corresponding perimeter that the beam intersects.

2. The charged particle beam column of claim 1 wherein each of the openings defines a circular shape.

3. The charged particle beam column of claim 1, wherein a cross section of the beam after passing through the openings has at least three approximately straight sides.

4. The charged particle beam column of claim 1 wherein each of the openings defines a four sided shape.

5. The charged particle beam column of claim 4 wherein a cross section of the beam after passing through the openings has sides at angles of 0, 45, 90, or 135 degrees to one another.

6. The charged particle beam column of claim 1, wherein at least one of the openings defines a shape having at least 3 linear sides.

7. The charged particle beam column of claim 1, wherein the at least one deflection device comprises:
   a first deflector positioned coaxial to the beam, spaced apart from the first aperture and the second aperture, and which controls a path of the beam towards the second opening; and
   a second deflector positioned coaxial to the beam, spaced apart from the second aperture and the third aperture, and which controls a path of the beam towards the third opening.

8. The charged particle beam column of claim 1 wherein the imaging device comprises a solenoid lens, the solenoid lens enclosing the apertures, the imaging device, and the deflection devices.

9. The charged particle beam column of claim 1 wherein the imaging device comprises:
   a first field lens, spaced apart from the first aperture, positioned coplanar to the first aperture, wherein the first field lens focuses the beam onto a plane midway between the first and second apertures;
   a first transfer lens, wherein the first transfer lens focuses an image located within the plane of the first aperture onto the plane of the second aperture;
   a second field lens, spaced apart from the second aperture, positioned coplanar to the second aperture, wherein the second field lens focuses the beam onto a plane midway between the second and third apertures; and
   a second transfer lens, wherein the second transfer lens focuses an image within the plane of the second aperture onto the plane of the third aperture.

10. The charged particle beam column of claim 1 wherein the imaging device comprises:
    a transfer lens, wherein the transfer lens focuses an image located midway between the first and second openings downstream from the first aperture;
    a first field lens combination, spaced apart from the transfer lens, wherein the first field lens combination focuses the beam onto the transfer lens; and
    a second field lens combination, spaced apart from the transfer lens, positioned coplanar to the third aperture, wherein the second field lens combination focuses the beam downstream from the third aperture.

11. The charged particle beam column of claim 1 further comprising:
    a fourth aperture, defining a fourth opening, the fourth aperture positioned coaxial to the beam and spaced apart from the third aperture.

12. A charged particle beam column for generating a variable shaped charged particle beam, the charged particle beam column comprising:
    a source of a charged particle beam;
    a first aperture defining a first opening having a first perimeter positioned coaxial to the beam and spaced apart from the source;

a second aperture defining a second opening having a second perimeter positioned coaxial to the beam and spaced apart from the first aperture;

a solenoid lens which controls focusing of the beam; and at least one deflector coaxial to the beam wherein the deflector controls a path of the beam through the openings such that the beam passing through each opening intersects only a portion less than the entire perimeter of at least one of the apertures thereby shaping the beam according to the portion of the corresponding perimeter that the beam intersects.

13. The charged particle beam column of claim 12 further comprising:

a third aperture, defining a third opening, the third aperture positioned coaxial to the beam and spaced apart from the second aperture.

14. The charged particle beam column of claim 13 further comprising:

a fourth aperture, defining a fourth opening, the fourth aperture positioned coaxial to the beam and spaced apart from the third aperture.

15. The charged particle beam column of claim 12, wherein the solenoid lens surrounds the apertures and the at least one deflection device.

16. A method for shaping a charged particle beam, the method comprising the acts of:

generating a charged particle beam;

shaping the charged particle beam by passage through a first opening having a first perimeter, wherein the beam intersects at least a portion of the first perimeter thereby shaping the beam according to the portion of the first perimeter that the beam intersects;

shaping the charged particle beam by passage through a second opening having a second perimeter, wherein the beam intersects at least a portion of the second perimeter thereby further shaping the beam according to the portion of the second perimeter that the beam intersects; and shaping the charged particle beam by passage through a third opening having a third perimeter, wherein the beam intersects at least a portion of the third perimeter thereby further shaping the beam according to the portion of the third perimeter that the beam intersects, wherein at least one of said shaping comprises shaping the charged particle beam such that the beam intersects only a portion less than the entire perimeter of the corresponding opening.

17. The method of claim 16 wherein each of the openings is circular.

18. The method of claim 16 wherein a cross section of the charged particle beam after passing through the openings has at least three approximately linear sides.

19. The method of claim 16, wherein each of the openings includes four sides.

20. The method of claim 19 wherein a cross section of the beam after passing through the openings has sides at angles of 0, 45, 90, or 135 degrees to one another.

21. The method of claim 16, wherein each of the openings has at least three linear sides.

22. The method of claim 16, further comprising the act of:

shaping the charged particle beam by passage through a fourth opening.

23. The method of claim 22 wherein each of the openings has at least three linear sides.

* * * * *